United States Patent
Nariyuki et al.

(10) Patent No.: US 8,350,207 B2
(45) Date of Patent: *Jan. 8, 2013

(54) RADIATION IMAGE DETECTION APPARATUS AND MANUFACTURING METHOD OF RADIATION IMAGE DETECTOR WITH SUBSTRATE SIDE CHARGE TRANSPORT LAYER

(75) Inventors: Fumito Nariyuki, Minamiashigara (JP); Munetaka Kato, Minamiashigara (JP); Keiichiro Sato, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/228,748

(22) Filed: Sep. 9, 2011

(65) Prior Publication Data

US 2012/0001201 A1  Jan. 5, 2012

Related U.S. Application Data

(62) Division of application No. 12/343,995, filed on Dec. 24, 2008, now Pat. No. 8,119,970.

(30) Foreign Application Priority Data

Dec. 28, 2007 (JP) .................................. 2007-340007

(51) Int. Cl.
   *H01J 40/14* (2006.01)
(52) U.S. Cl. .................................... 250/214 R; 250/239
(58) Field of Classification Search ............... 250/208.1, 250/239, 206, 214 R, 214.1, 207, 214 VT, 250/370.09, 370.11, 370.12, 591, 580, 363.02, 250/370.01, 370.08, 370.14, 581–584, 586; 257/257, 258, 290–294, 431, 436, 439–444, 448, 461, 458; 399/130, 131, 159, 147, 291; 430/32, 66, 67, 58.05, 56, 58.8, 133, 134; 378/98.6, 98.7, 98.8

See application file for complete search history.

(56) References Cited

U.S. PATENT DOCUMENTS

| | | | |
|---|---|---|---|
| 4,786,570 A | 11/1988 | Yu et al. | |
| 5,880,472 A | 3/1999 | Polischuk et al. | |
| 6,469,312 B2 | 10/2002 | Agano | |
| 6,642,534 B2 | 11/2003 | Shima et al. | |
| 6,723,995 B2 | 4/2004 | Rougeot | |
| 6,995,375 B2 * | 2/2006 | Sato et al. | 250/370.12 |
| 7,652,277 B2 | 1/2010 | Nariyuki et al. | |
| 2009/0084965 A1 * | 4/2009 | Irisawa et al. | 250/370.08 |

FOREIGN PATENT DOCUMENTS

JP  2004-146769 A  5/2004

* cited by examiner

*Primary Examiner* — Que T Le
*Assistant Examiner* — Jennifer Bennett
(74) *Attorney, Agent, or Firm* — Sugrue Mion, PLLC

(57) ABSTRACT

In a radiation image detection apparatus having a radiation image detector that includes the following stacked in the order listed below: a bias electrode, a photoconductive layer, a substrate side charge transport layer, and an active matrix substrate, the radiation image detector does not include an area adjacent to the interface between the substrate side charge transport layer and photoconductive layer having an oxygen or chlorine element density not less than two times the average density of oxygen or chlorine element in the substrate side charge transport layer.

10 Claims, 6 Drawing Sheets

| | CONSECUTIVE FORMATION OF SECOND CHARGE TRANSPORT LAYER AND PHOTOCONDUCTIVE LAYER | SECOND CHARGE TRANSPORT LAYER | ORGANIC POLYMER LAYER | CONSECUTIVE FORMATION OF FIRST CHARGE TRANSPORT LAYER AND PHOTOCONDUCTIVE LAYER | FIRST CHARGE TRANSPORT LAYER | EVALUATION RESULTS | | | | | |
|---|---|---|---|---|---|---|---|---|---|---|---|
| | | | | | | WITHOUT BACKLIGHT | | | WITH BACKLIGHT | | |
| | | | | | | DARK CURRENT | SHORT TERM LAG | LONG TERM LAG | DARK CURRENT | SHORT TERM LAG | LONG TERM LAG |
| EXAMPLE 1 | ○ | $Sb_{45}S_{55}$ | PROVIDED | × | $Sb_{42}S_{58}$ | ○ | ◎ | ◎ | ○ | ◎ | ◎ |
| EXAMPLE 2 | ○ | $Sb_{45}S_{55}$ | PROVIDED | × | $Sb_{50}S_{50}$ | ○ | ◎ | ◎ | ○ | ◎ | ◎ |
| EXAMPLE 3 | ○ | $Sb_2S_3$ | NOT PROVIDED | ○ | $Sb_2S_3$ | △ | △ | ○ | × | ○ | ○ |
| EXAMPLE 4 | ○ | $Sb_{45}S_{55}$ | NOT PROVIDED | ○ | $Sb_2S_3$ | △ | △ | ○ | △ | ○ | ○ |
| EXAMPLE 5 | ○ | $Sb_{45}S_{55}$ | PROVIDED | × | $Sb_2S_3$ | ○ | ◎ | ○ | ○ | ◎ | ○ |
| EXAMPLE 6 | BAKE | $Sb_{45}S_{55}$ | PROVIDED | × | $Sb_{42}S_{58}$ | ○ | ○ | ◎ | ○ | ○ | ◎ |
| EXAMPLE 7 | ○ | $Sb_{45}S_{55}$ | NOT PROVIDED | × | $Sb_2S_3$ | ○ | ○ | ○ | ○ | ○ | ○ |
| EXAMPLE 8 | ○ | $Sb_{50}S_{50}$ | NOT PROVIDED | × | $Sb_{50}S_{50}$ | ○ | ○ | ◎ | ○ | ○ | ◎ |
| COMPARATIVE EXAMPLE 1 | × | $Sb_2S_3$ | NOT PROVIDED | × | $Sb_2S_3$ | △ | × | × | △ | △ | × |

FIG.7

| | Consecutive formation of second charge transport layer and photoconductive layer | Second charge transport layer | Organic polymer layer | Consecutive formation of first charge transport layer and photoconductive layer | First charge transport layer | Evaluation Results | | | | | |
|---|---|---|---|---|---|---|---|---|---|---|---|
| | | | | | | Without Backlight | | | With Backlight | | |
| | | | | | | Dark Current | Short Term Lag | Long Term Lag | Dark Current | Short Term Lag | Long Term Lag |
| Example 1 | ○ | $Sb_{45}S_{55}$ | PROVIDED | × | $Sb_{42}S_{58}$ | ○ | ◎ | ◎ | ○ | ◎ | ◎ |
| Example 2 | ○ | $Sb_{45}S_{55}$ | PROVIDED | × | $Sb_{50}S_{50}$ | ○ | ◎ | ◎ | ○ | ◎ | ◎ |
| Example 3 | ○ | $Sb_2S_3$ | NOT PROVIDED | ○ | $Sb_2S_3$ | △ | △ | ○ | × | ○ | ○ |
| Example 4 | ○ | $Sb_{45}S_{55}$ | NOT PROVIDED | ○ | $Sb_2S_3$ | △ | △ | ○ | △ | ○ | ○ |
| Example 5 | ○ | $Sb_{45}S_{55}$ | PROVIDED | × | $Sb_2S_3$ | ○ | ◎ | ○ | ○ | ◎ | ○ |
| Example 6 | BAKE | $Sb_{45}S_{55}$ | PROVIDED | × | $Sb_{42}S_{58}$ | ○ | ○ | ◎ | ○ | ○ | ◎ |
| Example 7 | ○ | $Sb_{45}S_{55}$ | NOT PROVIDED | × | $Sb_2S_3$ | ○ | ○ | ○ | ○ | ○ | ○ |
| Example 8 | ○ | $Sb_{50}S_{50}$ | NOT PROVIDED | × | $Sb_{50}S_{50}$ | △ | ○ | ◎ | ○ | ○ | ◎ |
| Comparative Example 1 | × | $Sb_2S_3$ | NOT PROVIDED | × | $Sb_2S_3$ | △ | × | × | △ | △ | × |

RADIATION IMAGE DETECTION APPARATUS AND MANUFACTURING METHOD OF RADIATION IMAGE DETECTOR WITH SUBSTRATE SIDE CHARGE TRANSPORT LAYER

This application is a divisional application of U.S. application Ser. No. 12/343,995, filed Dec. 24, 2008, which claims priority to JP 2007-340007, filed Dec. 28, 2007, each of which is incorporated herein by reference in its entirety.

BACKGROUND OF THE INVENTION

1. Field of the Invention

The present invention relates to a radiation image detection apparatus having a radiation image detector that generates electric charges by receiving a recording electromagnetic wave representing a radiation image and records the radiation image by storing the electric charges. The invention also relates to a manufacturing method of the radiation image detector.

2. Description of the Related Art

Various types of radiation image detectors that record a radiation image of a subject by receiving radiation transmitted through the subject have been proposed and put into practical use in medical and other fields.

For example, radiation image detectors using amorphous selenium that generates electric charges by receiving radiation are known, and a so-called TFT readout type is proposed as one of such radiation image detectors.

As for the TFT readout type radiation image detectors, for example, the following detector is proposed. That is, a detector that includes the following stacked on top of another: a bias electrode to which a bias voltage is applied; a photoconductive layer that generates electric charges by receiving radiation; and an active matrix substrate having multiple pixels disposed two-dimensionally, each with a charge collecting electrode for collecting the electric charges generated in the photoconductive layer, a storage capacitor for storing the electric charges collected by the charge collecting electrode, and a TFT switch for reading out the electric charges stored in the storage capacitor.

When recording a radiation image in the TFT readout type radiation image detector, radiation transmitted through a subject and representing a radiation image of the subject is irradiated on the radiation image detector from the bias electrode side, while, for example, a positive voltage is applied to the bias electrode from a power source.

The radiation irradiated on the radiation image detector transmits through the bias electrode, and is irradiated on the photoconductive layer. Then, electric charge pairs are generated in the photoconductive layer by the irradiation of the radiation, and the negative charges of the electric charge pairs are combined with positive charges charged on the bias electrode and dissolved, while the positive charges of the charge pairs are collected by each charge collecting electrode of each pixel of the active matrix substrate and stored in each storage capacitor as latent image charges, whereby the radiation image is recorded.

Thereafter, the electric charges stored in the storage capacitors are read out by turning ON the TFT switches on the active matrix substrate according to control signals outputted from a gate driver and the charge signals are detected by charge amplifiers, whereby image signals according to the radiation image are read out.

As one of the radiation image detectors using the active matrix substrate described above, for example, U.S. Pat. No. 6,642,534 proposes a radiation image detector that includes a bias electrode, a Se-based X-ray detection layer, a charge transport layer formed of $Sb_2S_3$, and an active matrix substrate stacked on top of another. The aforementioned patent publication describes that the provision of the charge transport layer may prevent injection of electron holes into the X-ray detection layer from the active matrix substrate, whereby image quality degradation is prevented.

In a radiation image detector having the charge transport layer, the interface between the charge transport layer and X-ray detection layer becomes the interface through which the electric charges generated in the X-ray detection layer by the irradiation of X-rays are transported. A study conducted by the inventor of the present invention, however, has revealed that impurities, such as oxygen, water, chloride compound, and the like, may sometimes deposit in the interface depending on the manufacturing method, whereby electric charges generated in the X-ray detection layer are trapped. The study has also revealed that the trap effect may give a favorable or unfavorable influence to the image quality depending on the position of the charge transport layer in the detector.

In view of the circumstances described above, it is an object of the present invention to provide a radiation image detection apparatus having a high image quality radiation image detector capable of appropriately controlling the charge traps described above. It is a further object of the present invention to provide a manufacturing method of the radiation image detector.

SUMMARY OF THE INVENTION

A radiation image detection apparatus of the present invention is an apparatus having a radiation image detector that includes the following stacked in the order listed below:

a bias electrode to which a bias voltage is applied;

a photoconductive layer that generates electric charges by receiving a recording electromagnetic wave representing a radiation image;

a substrate side charge transport layer that transports the electric charges generated in the photoconductive layer; and an active matrix substrate having multiple charge collecting electrodes disposed thereon for collecting the electric charges generated in the photoconductive layer, wherein the radiation image detector does not include an area adjacent to the interface between the substrate side charge transport layer and photoconductive layer having an oxygen or chlorine element density not less than two times the average density thereof in the substrate side charge transport layer.

The radiation image detection apparatus described above may further includes a bias electrode side charge transport layer between the bias electrode and photoconductive layer, and the bias electrode side charge transport layer may include an area having an oxygen element density not less than three times the average density thereof in the bias electrode side charge transport layer.

Further, the bias electrode side charge transport layer may be a layer that includes antimony sulfide.

Still further, the bias electrode side charge transport layer may have an average composition of $Sb_xS_{100-x}$ ($41 \leq x \leq 60$).

Further, the apparatus may further include an organic polymer layer that includes an electron hole blocking material between the bias electrode side charge transport layer and photoconductive layer.

Still further, the electron hole blocking material may be at least one type of carbon cluster selected from a group consisting of Fullerene $C_{60}$, Fullerene $C_{70}$, fullerene oxide, and derivatives thereof.

Further, the apparatus may further include a light emitting means for emitting light on the radiation image detector from the side of the active matrix substrate while at least the recording electromagnetic wave is irradiated on the radiation image detector, and the substrate side charge transport layer may have a transmission factor not greater than 10% for the light.

Still further, the substrate side charge transport layer may be a layer that includes antimony sulfide.

Further, the substrate side charge transport layer may have an average composition of $Sb_xS_{100-x}$ ($41 \leq x \leq 60$).

A first radiation image detector manufacturing method of the present invention is a manufacturing method of a radiation image detector that includes the following stacked in the order listed below: a bias electrode to which a bias voltage is applied; a photoconductive layer that generates electric charges by receiving a recording electromagnetic wave representing a radiation image; a substrate side charge transport layer that transports the electric charges generated in the photoconductive layer; and an active matrix substrate having multiple charge collecting electrodes disposed thereon for collecting the electric charges generated in the photoconductive layer, the method including the steps of:

forming the substrate side charge transport layer on the active matrix substrate in a vacuum chamber; and without exposing the substrate side charge transport layer to gas that includes oxygen or water, forming thereon the photoconductive layer.

A second radiation image detector manufacturing method of the present invention is a manufacturing method of a radiation image detector that includes the following stacked in the order listed below: a bias electrode to which a bias voltage is applied; a photoconductive layer that generates electric charges by receiving a recording electromagnetic wave representing a radiation image; a substrate side charge transport layer that transports the electric charges generated in the photoconductive layer; and an active matrix substrate having multiple charge collecting electrodes disposed thereon for collecting the electric charges generated in the photoconductive layer, the method including the steps of:

forming the substrate side charge transport layer on the active matrix substrate in a vacuum chamber;

exposing the substrate side charge transport layer to gas that includes oxygen or water and returning the layer to the vacuum chamber; and exposing the substrate side charge transport layer to an environmental temperature not less than 100° C. and forming thereon the photoconductive layer.

In the first or second radiation image detector manufacturing method, the radiation image detector may further includes a bias electrode side charge transport layer between the bias electrode and photoconductive layer, and the method may further include, following the step of forming the photoconductive layer, the steps of exposing the photoconductive layer to gas that includes not less than 1 vol % of oxygen or water, and returning the photoconductive layer to the vacuum chamber and forming thereon the bias electrode side charge transport layer.

According to the radiation image detection apparatus of the present invention, the radiation image detector does not include an area adjacent to the interface between the substrate side charge transport layer and photoconductive layer having an oxygen or chlorine element density not less than two times the average density thereof in the substrate side charge transport layer. This allows the reduction of charge trap density due to impurities, such as oxygen, chlorine, and the like, whereby image lag characteristics may be improved.

Further, where the radiation image detection apparatus further includes a bias electrode side charge transport layer between the bias electrode and photoconductive layer, and the bias electrode side charge transport layer includes an area having an oxygen element density not less than three times the average density thereof in the bias electrode side charge transport layer, the area functions as a charge blocking layer that reduces the amount of electric charges drawn into the photoconductive layer from the bias electrode while the recording electromagnetic wave is irradiated. As the result, short term lag, to be described later, may be reduced.

Still further, where the bias electrode side charge transport layer has an average composition of $Sb_xS_{100-x}$ ($41 \leq x \leq 60$), the composition ratio of Sb in the bias electrode side charge transport layer may become greater than the stoichiometric composition, whereby electron transportability may be improved. This allows electric charges trapped in the bulk of the photoconductive layer to be discharged to the bias electrode more efficiently, whereby long term lag characteristics, to be described later, may be improved.

Further, where an organic polymer layer that includes an electron hole blocking material is further provided between the bias electrode side charge transport layer and photoconductive layer, defects in the interface of the photoconductive layer on the side of the bias electrode may be reduced. This may reduce electric charges trapped in the defects and improve short term lag characteristics, to be described later.

Still further, where a light emitting means for emitting light on the radiation image detector from the side of the active matrix substrate while at least the recording electromagnetic wave is irradiated on the radiation image detector is further provided, and the substrate side charge transport layer has a transmission factor not greater than 10% for the light, the light emitted from the light emitting means may be prevented from reaching the inside of the photoconductive layer of the radiation image detector, whereby dark current generated by the emission of the light may be prevented.

Further, where the substrate side charge transport layer has an average composition of $Sb_xS_{100-x}$ ($41 \leq x \leq 60$), the composition ratio of Sb in the substrate side charge transport layer may become greater than the stoichiometric composition, whereby the light may be prevented sufficiently from reaching the inside of the photoconductive layer.

According to the first radiation image detector manufacturing method of the present invention, the substrate side charge transport layer is formed on the active matrix substrate in a vacuum chamber, and without exposing the substrate side charge transport layer to gas that includes oxygen or water, the photoconductive layer is formed thereon. This allows the radiation image detector to be manufactured without depositing impurities that trap electric charges in the interface between the substrate side charge transport layer and photoconductive layer.

According to the second radiation image detector manufacturing method of the present invention, the substrate side charge transport layer is formed on the active matrix substrate in a vacuum chamber, then the substrate side charge transport layer is exposed to gas that includes oxygen or water and returned to the vacuum chamber, and after exposing the substrate side charge transport layer to an environmental temperature not less than 100° C., the photoconductive layer is formed. That is, even though the substrate side charge transport layer is exposed to gas that includes oxygen or water, the method may provide comparative effects to those of the first radiation image detector manufacturing method by performing a baking process on the substrate side charge transport layer.

Further, in the first or second radiation image detector manufacturing method, where the radiation image detector further includes a bias electrode side charge transport layer between the bias electrode and photoconductive layer, and the manufacturing method further includes, following the step of forming the photoconductive layer, the steps of exposing the photoconductive layer to gas that includes not less than 1 vol % of oxygen or water, and returning the photoconductive layer to the vacuum chamber and forming the bias electrode side charge transport layer, an area that includes more oxygen element and capable of acting as a charge blocking layer may be formed in the bias electrode side charge transport layer.

BRIEF DESCRIPTION OF THE DRAWINGS

FIG. 7 illustrates evaluation results of dark current, short term lag, and long term lag of example radiation image detectors of the radiation image detection apparatus of the present invention and a comparative example.

DESCRIPTION OF THE PREFERRED EMBODIMENTS

Figure 1:
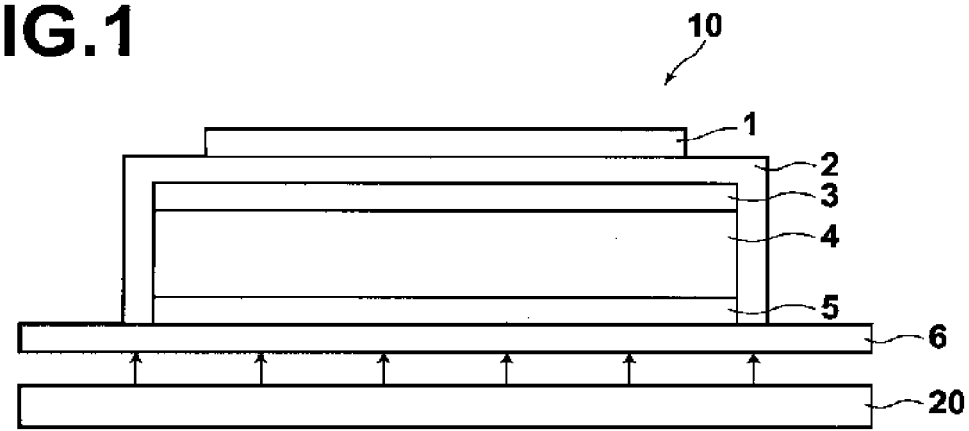
FIG. 1 is a cross-sectional view of an embodiment of the radiation image detection apparatus according to the present invention.

Hereinafter, an exemplary embodiment of the radiation image detection apparatus according to the present invention will be described with reference to the accompanying drawings. The radiation image detection apparatus of the present embodiment includes a so-called TFT readout type radiation image detector. FIG. 1 is a cross-sectional view of the radiation image detection apparatus of the present embodiment, illustrating a schematic configuration thereof.

The radiation image detection apparatus of the present embodiment includes radiation image detector 10 that generates electric charges by receiving radiation and records a radiation image by storing the charges therein, and surface light source 20 that emits light on radiation image detector 10 while radiation is irradiated thereon.

Radiation image detector 10 includes the following stacked in the order listed below: bias electrode 1 to which a bias voltage is applied, first charge transport layer 2 (bias electrode side charge transport layer of the present invention), organic polymer layer 3, photoconductive layer 4 that generates electric charges by receiving radiation representing a radiation image, second charge transport layer 5 (substrate side charge transport layer of the present invention) that transports the electric charges generated in photoconductive layer 4, and an active matrix substrate 6 having multiple charge collecting electrodes disposed thereon for collecting the electric charges generated in the photoconductive layer and transmitted through second charge transport layer 5.

Bias electrode 1 is formed of a conductive material having a low resistance, such as Au, Al, or the like. It is noted that a positive bias voltage is applied to bias electrode 1 of the radiation image detector of the present embodiment.

First charge transport layer 2 is formed of a material that includes antimony sulfide. The average composition of the antimony sulfide is $Sb_yS_{100-y}$ ($41 \leq y \leq 60$). More preferably, the value of y is $42 \leq y \leq 50$. Further, first charge transport layer 2 includes an area having an oxygen element density not less than three times the average density thereof in first charge transport layer 2. For example, the area may be formed in first charge transport layer 2 adjacent to the interface thereof on the side of photoconductive layer 4. A method for forming the area will be described later. The term "adjacent to the interface" as used herein refers to the range, when the composition of first charge transport layer 2 is measured from the side of first charge transport layer 2 toward photoconductive layer 4, from a point where the density of the major component of first charge transport layer 2 starts decreasing from the average density thereof in first charge transport layer 2 to a point where the density thereof is decreased to about $1/100$ of the average density. Although it is preferable that first charge transport layer 2 be provided, but is not necessarily required.

Organic polymer layer 3 is formed of an organic polymer material with an electron hole blocking material added thereto. As for the organic polymer material, for example, polycarbonate may be used. As for the electron hole blocking material, for example, at least one type of carbon cluster selected from the group consisting of Fullerene $C_{60}$, Fullerene $C_{70}$, fullerene oxide, and derivatives thereof may be used. Although it is preferable that organic polymer layer 3 be provided, but is not necessarily required.

Photoconductive layer 4 has electromagnetic conductivity and generates electric charges therein when irradiated with radiation. As for the material of photoconductive layer 4, for example, a-Se, $HgI_2$, $PbI_2$, CdS, CdSe, CdTe, $BiI_3$, or the like may be used. In particular, an amorphous-based a-Se film with a film thickness in the range from 100 to 1000 μm is preferably used.

Second charge transport layer 5 is formed of a material with the average composition of $Sb_xS_{100-x}$ ($41 \leq x \leq 60$). More preferably, the value of x is $42 \leq x \leq 50$. Further, preferably the thickness of second charge transport layer 5 is not less than 0.5 μm, and more preferably about 2 μm. Still further, it is preferable that second charge transport layer 5 be formed so as to have a transmission factor in the range from 0.01 to 10% for the light (with a wavelength about 525 nm in the present embodiment) emitted from surface light source 20. For example, the value of transmission factor described above may be obtained by adjusting the composition ratio of Sb or the thickness.

Further, in the radiation imaged detector of the present embodiment, photoconductive layer 4 and second charge transport layer 5 are formed such that an area having an oxygen or chlorine element density not less than two times the average density thereof in second charge transport layer 5 is not formed adjacent to the interface between photoconductive layer 4 and second charge transport layer 5. A method for forming photoconductive layer 4 and second charge transport layer 5 in the manner as described above will be described later. The term "adjacent to the interface" as used herein refers to the range, when the composition of second charge transport layer 5 is measured from the side of second charge transport layer 5 toward photoconductive layer 4, from a point where the density of the major component of second charge transport layer 5 starts decreasing from the average density thereof in second charge transport layer 5 to a point where the density thereof is decreased to about 1/100 of the average density.

Further, second charge transport layer 5 may be formed of at least one of cerium oxide, zinc selenide, zinc telluride, zinc sulfide, and arsenic selenide, other than antimony sulfide. Where second charge transport layer 5 is formed of cerium oxide, it is formed so as not to include an area with a chlorine element density not less than two times the average density thereof in second charge transport layer 5.

Figure 2:
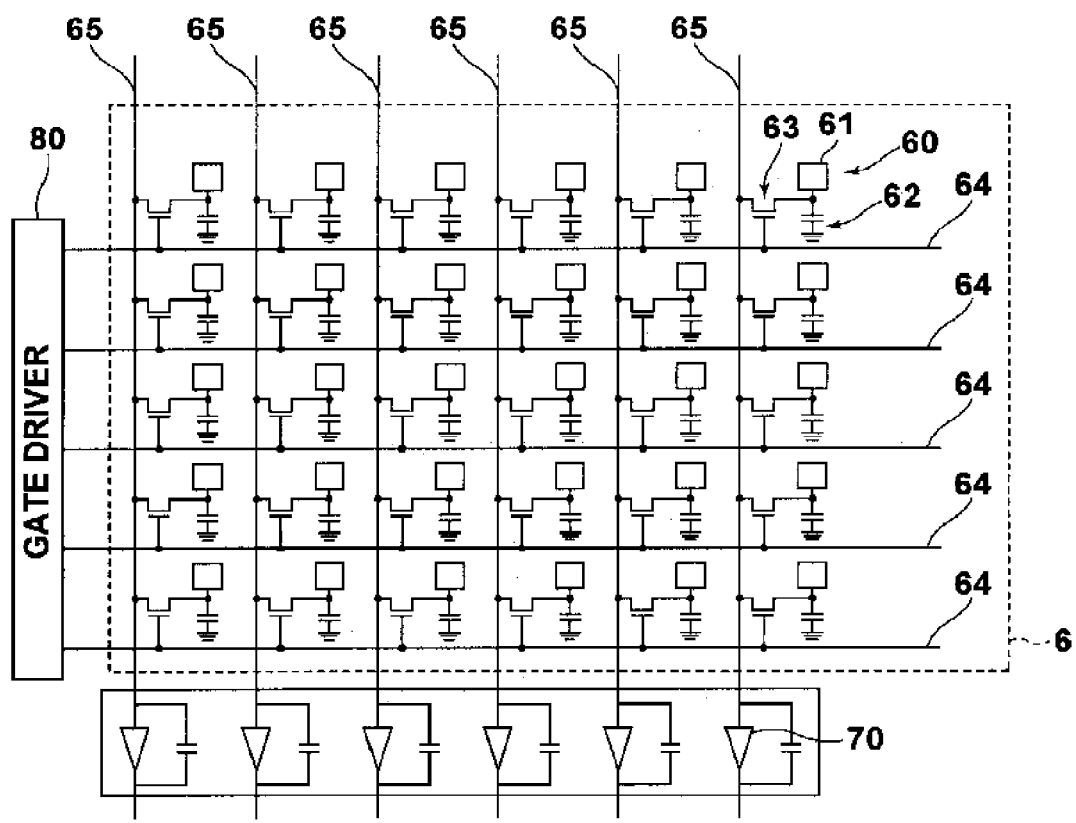
FIG. 2 a plan view of an active matrix substrate of the radiation image detector shown in FIG. 1.

Now referring to FIG. 2, there is shown a plan view of active matrix substrate 6. As illustrated in detail in FIG. 2, active matrix substrate 6 includes multiple pixels 60 disposed two-dimensionally, each having charge collecting electrode 61 for collecting electric charges generated in photoconductive layer 4, storage capacitor 62 for storing the electric charges collected by charge collecting electrode 61, and TFT switch 63 for reading out the electric charges stored in storage capacitor 62. In addition, multiple scanning wires 64 for turning ON/OFF TFT switches 63 of respective pixels 60 and multiple data wires 65 for reading out electric charges stored in storage capacitors 62 are disposed in a lattice pattern. Readout circuit 70 that includes an amplifier for reading out signal charges flowing out to each data wire 65 is connected at the end thereof, and each scanning wire 64 is connected to a gate driver 80 that outputs a control signal for turning ON/OFF each TFT switch 63.

As for the material of charge collecting electrode 61 of active matrix substrate 6, any material may be used as long as it is a conductive material, but the electrode is preferable to transmits visible light and, for example, ITO or IZO may preferably be used for that purpose.

Surface light source 20 is a light source of surface mounted light-emitting diodes with a center emission wavelength of about 525 nm. Surface light source 20 may be provided separately from radiation image detector 10, as shown in FIG. 1, or it may be bonded to active matrix substrate 6 by an adhesive. Surface light source 20 is capable of uniformly emitting light on photoconductive layer 4 by transmitting through active matrix substrate 6, while radiation is irradiated on radiation image detector 10. It is noted that active matrix substrate 6 and the adhesive described above are transparent to the wavelength of light emitted from surface light source 20.

Reasons for providing surface light source 20 as in the radiation image detection apparatus of the present invention will now be described.

In radiation image detector 10 that uses active matrix substrate 6, electrodes or the like for discharging electric charges are not provided at the spaces between charge collecting electrodes divided with respect to each pixel, so that electric charges generated by the irradiation of radiation tend to accumulate in the spaces. As the result, the electric field formed in photoconductive layer 4 by the application of a voltage to bias electrode 1 is distorted and the sensitive area of photoconductive layer 4 is varied, posing a problem of fluctuation of the sensitivity thereof. Another problem is that the charges accumulated in the spaces between the charge collecting electrodes are gradually discharged as image lag when reading out charge signals after the irradiation of radiation is stopped, whereby image lag characteristics are degraded (in particular, it is problematic in short-term lag to be described later).

Consequently, in the radiation image detector of the present embodiment, surface light source 20 is provided for emitting backlight from the side of active matrix substrate 6. Emission of backlight to radiation image detector 10 by surface light source 20 while irradiating radiation on radiation image detector 10 allows electric charges to be accumulated in the spaces between the charge collecting electrodes in advance, whereby the electric field formed in photoconductive layer 4 may be distorted in advance. Consequently, electric charges generated by the irradiation of radiation move along the electric field distorted in advance without accumulating in the spaces and are collected by the charge collecting electrodes. That is, the variation in the sensitive area of photoconductive layer 4, and hence sensitivity variation, may be prevented. Further, continuation of the backlight emission after the radiation is stopped may prevent the electric charges accumulated in the spaces between charge collecting electrodes from gradually discharging as image lag output.

Further, in the present embodiment, a so-called direct conversion type radiation image detector that directly converts radiation to electric charges has been described. But the present invention is not limited to this, and may also be applied to a radiation image detector having a configuration similar to that of a so-called indirect conversion type radiation image detector that converts radiation to light by a phosphor first, and then converts the light to electric charges. The term "radiation image detector having a configuration similar to that of indirect conversion type radiation image detector" as used herein refers to a radiation image detector that includes a a-Se layer thinner than that of the direct conversion type radiation image detector, a light transmissive bias electrode, and a phosphor above the bias electrode, thereby converting light emitted from the phosphor to electric charges. In a radiation image detector configure in the manner as described above, the thickness of the photoconductive layer is about 1 to 30 μm and the storage capacitors are not essential.

Still further, in the radiation image detector of the present embodiment, an active matrix substrate having multiple TFT switches disposed thereon is used. But the present invention may also be applied to a radiation image detector that includes an active matrix substrate having multiple switching elements, such as MOS switches, disposed thereon.

EXAMPLES

Examples of radiation image detector of the radiation image detection apparatus of the present invention will now be described in detail.

Example 1

Example 1 of the radiation image detector will be described.

Example 1 of the radiation image detector was produced in the following manner. First, antimony sulfide material with composition of $Sb_{45}S_{55}$ is put in a crucible, then the crucible and active matrix substrate 6 are put in a deposition system, and the inside of the deposition system is vacuumed.

Then, the crucible holding the $Sb_{45}S_{55}$ is heated by a resistive heater to heat the $Sb_{45}S_{55}$ to a temperature of 530° C., whereby second charge transport layer 5 is formed on active matrix substrate 6 with a film thickness of 2 μm.

Incidentally, the antimony sulfide material with composition of $Sb_{45}S_{55}$ may be produced as follows. First, amounts of simple sulfur and antimony, each corresponding to each desired composition ratio, are measured and measured amounts are put in a glass vessel. Then the vessel is vacuumed and sealed, and while the glass vessel is heated to a temperature of the melting point of antimony (630° C.) or higher, the glass vessel is shaken and agitated (for 15 hours or more) to obtain antimony sulfide melt with uniform composition.

Thereafter, the antimony sulfide melt is naturally cooled, whereby the antimony sulfide material with the desired composition may be produced.

Further, the composition of second charge transport layer may be measured by various methods including the following:

1) after exposing the measuring target layer, digging down the layer by ion sputtering and measuring the composition by secondary ion mass spectrometer (SIMS),
2) carving out a cross-section of the radiation image detector and mapping the composition of the portion corresponding to second charge transport layer 5 by energy dispersive X-ray analyzer (EDX),
3) scratching off the portion corresponding to second charge transport layer from the radiation image detector and measuring the average composition thereof by X-ray fluorescence spectrometry (XRF), and
4) separating the radiation image detector in the layer stacking direction adjacent to second charge transport layer 5 and performing the measurement by thin-film XRF.

Following the formation of second charge transport layer 5 on active matrix substrate 6 in the vacuum chamber in the manner as described above, Se material that includes 10 ppm of Na is deposited on second charge transport layer 5 to form photoconductive layer 4 of amorphous Se having a film thickness of 1000 µm without exposing second charge transport layer 5 to gas that includes oxygen or water.

Figure 3:
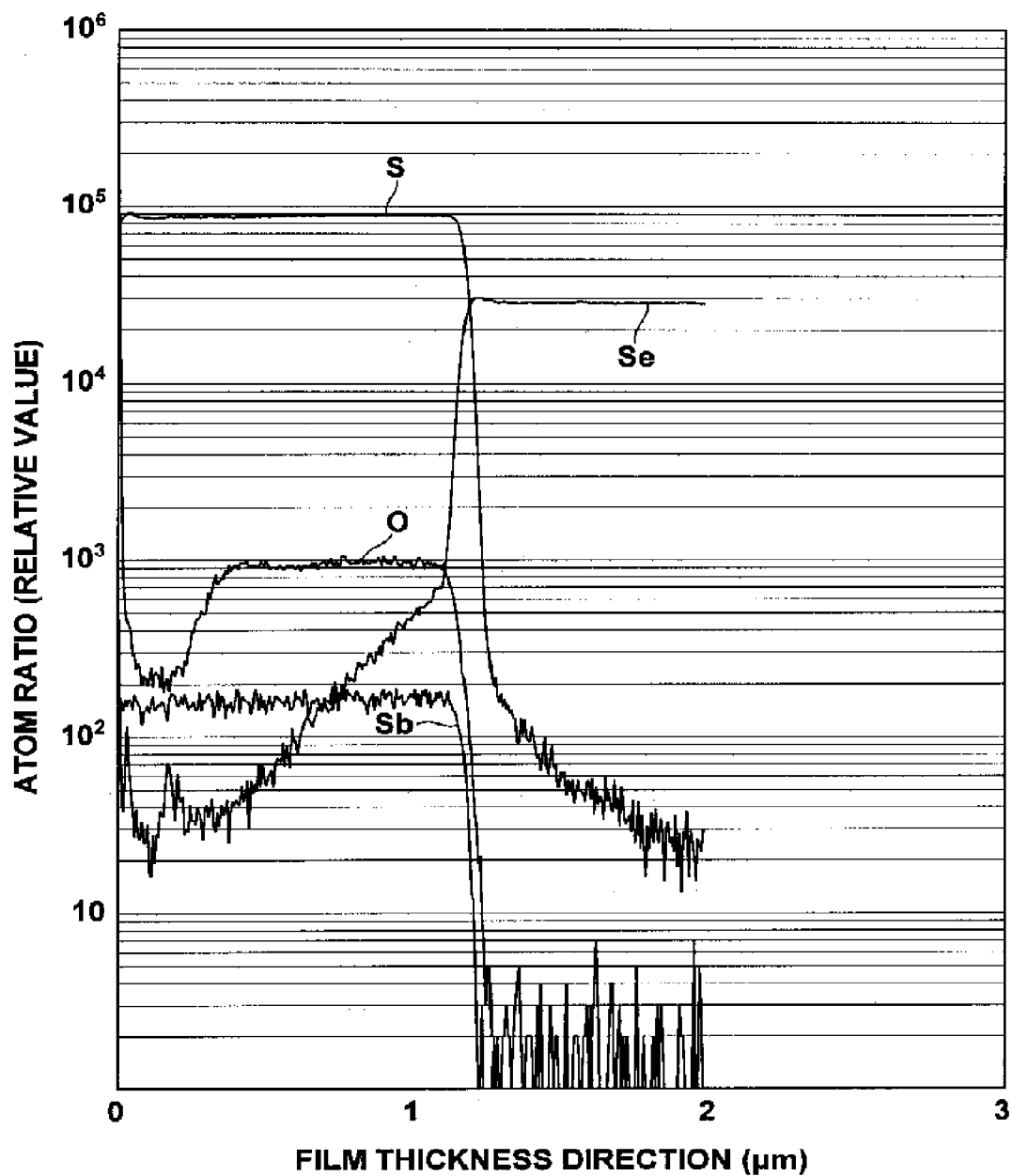
FIG. 3 illustrates the composition of a second charge transport layer and a photoconductive layer when formed consecutively.
Figure 4:
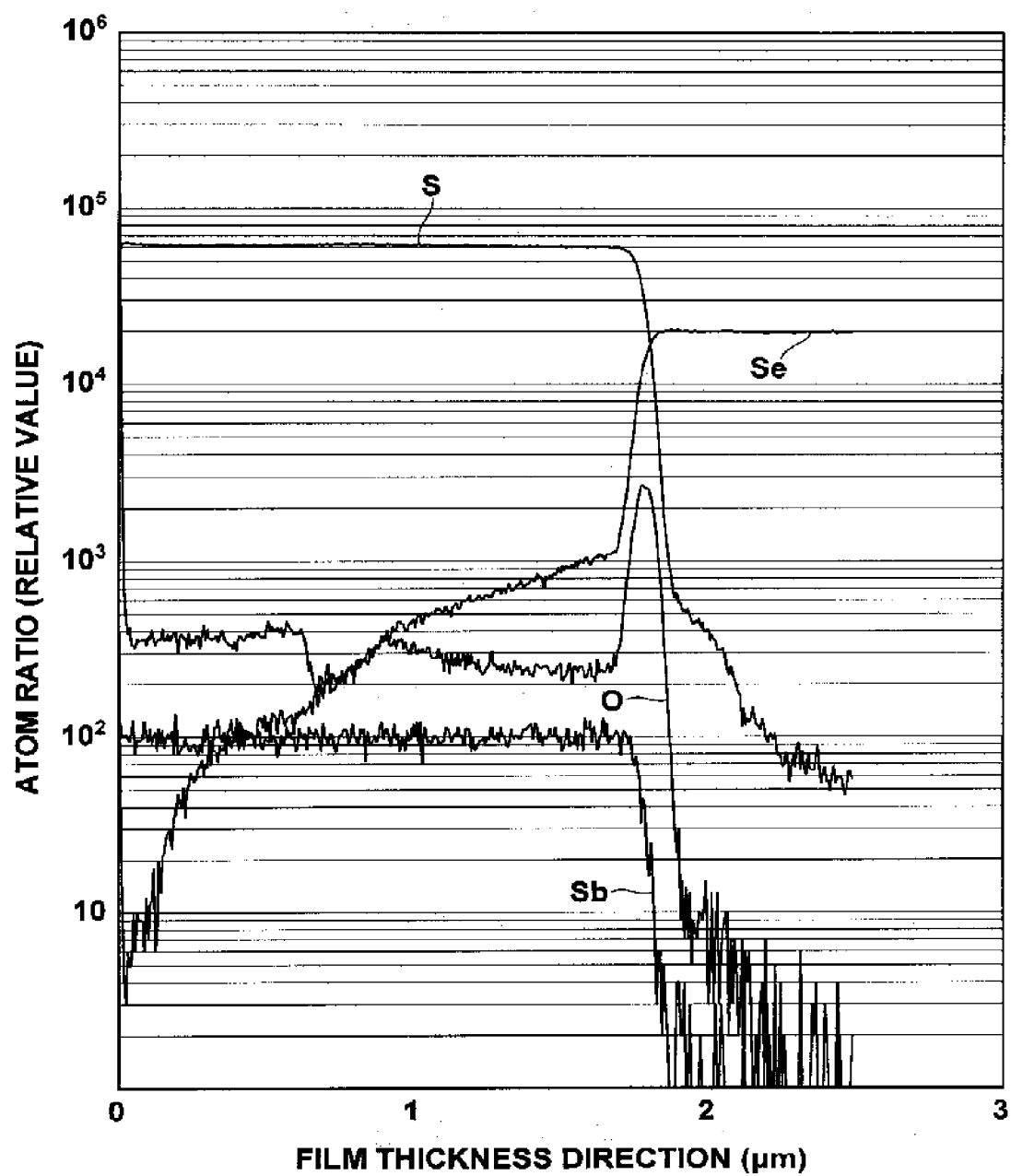
FIG. 4 illustrates the composition of the second charge transport layer and photoconductive layer when not formed consecutively.

Formation of photoconductive layer 4 without exposing second charge transport layer 5 to gas that includes oxygen or water in the manner as described above following the formation of second charge transport layer 5 may prevent an area having an oxygen or chlorine element density not less than two times the average density thereof in second charge transport layer 5 from being formed adjacent to the interface between photoconductive layer 4 and second charge transport layer 5. FIG. 3 illustrates the composition of second charge transport layer 5 and photoconductive layer 4 adjacent to the interface when these layers are formed in the manner as described above. Note that FIG. 3 shows the composition when $Sb_2S_3$, instead of $Sb_{45}S_{55}$, is used as the material of second charge transport layer 5, but it is thought that the identical results may be obtained with respect to oxygen and chlorine elements when $Sb_{45}S_{55}$ is used. For comparison purposes, FIG. 4 shows the composition of second charge transport layer 5 and photoconductive layer 4 adjacent to the interface thereof when second charge transport layer 5 is exposed to gas that includes oxygen or water after formed and then photoconductive layer 4 is formed thereon. It shows that an area having an oxygen element density not less than two times the average density thereof in second charge transport layer 5 is formed adjacent to the interface between second charge transport layer 5 and photoconductive layer 4. The composition of second transport layer 5 and photoconductive layer 4 is measured by SIMS while digging down the layers from the second charge transport layer side. Quantum numbers used in SIMS for S, Sb, Se, and O are 34, 121, 80, and 16 respectively.

Next, after photoconductive layer 4 is formed in the manner as described above, organic polymer layer 3 that includes Fullerene $C_{60}$ is formed. As Fullerene $C_{60}$, nanom purpule ($C_{60}$) available from Frontier Carbon Corporation is used. Polycarbonate resin (PCz) (Yupiron PCZ-400 available from Mitsubishi Gas Chemical Company, Inc.) and Fullerene $C_{60}$ are dissolved in o-dichlorobenzene at a ratio of 30 to 70 wt % to produce a coating solution having a solid content concentration of 1.5 wt %. Then, the solution is applied on photoconductive layer 4 using an inkjet coater, and the solvent is evaporated by a vacuum drier, whereby organic polymer layer 3 with a film thickness of 0.2 µm is obtained.

After organic polymer layer 3 is formed, the substrate is returned to the vacuum chamber. In the present example, organic polymer layer 3 is formed by the application of solution, so that the substrate is exposed to air (gas that includes not less than 1 vol % of oxygen or water) during a period just before to after the film coating. Where organic polymer layer 3 is formed by a method other than the coating, it is preferable that the substrate be exposed to air before forming organic polymer layer 3. In addition, it may also be exposed to air after that. Then, an antimony sulfide material with composition of $Sb_{42}S_{58}$ is heated to a temperature of 545° C. to form first charge transport layer 2 of antimony sulfide (with the average composition of $Sb_{42}S_{58}$) with a film thickness of 0.6 µm on organic polymer layer 3, having a larger area than organic polymer layer 3. The method for producing an antimony sulfide material having desired composition and the method for measuring the composition of first charge transport layer 2 are identical to those of second charge transport layer 5.

Figure 5:
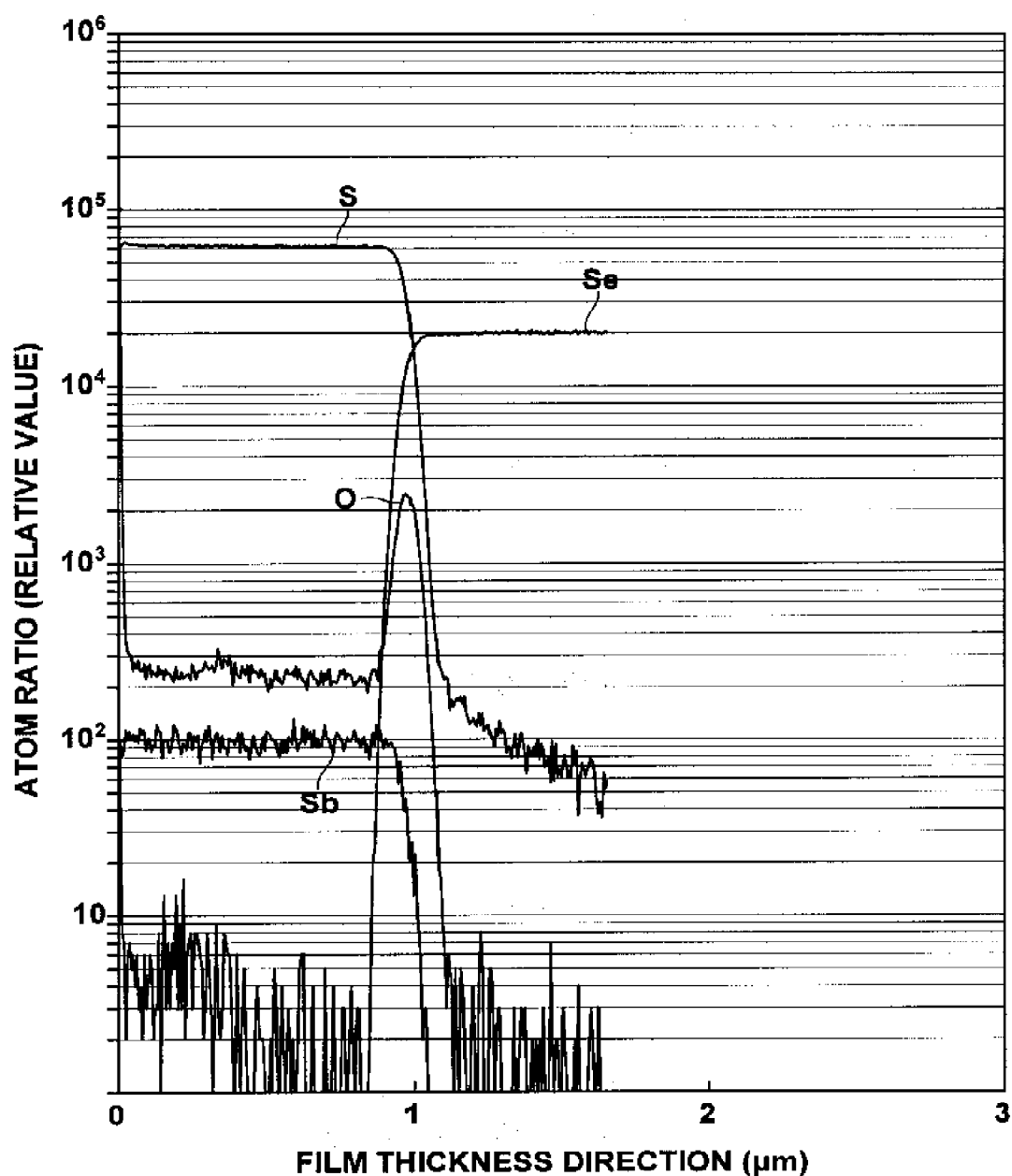
FIG. 5 illustrates the composition of a first charge transport layer and the photoconductive layer when not formed consecutively.
Figure 6:
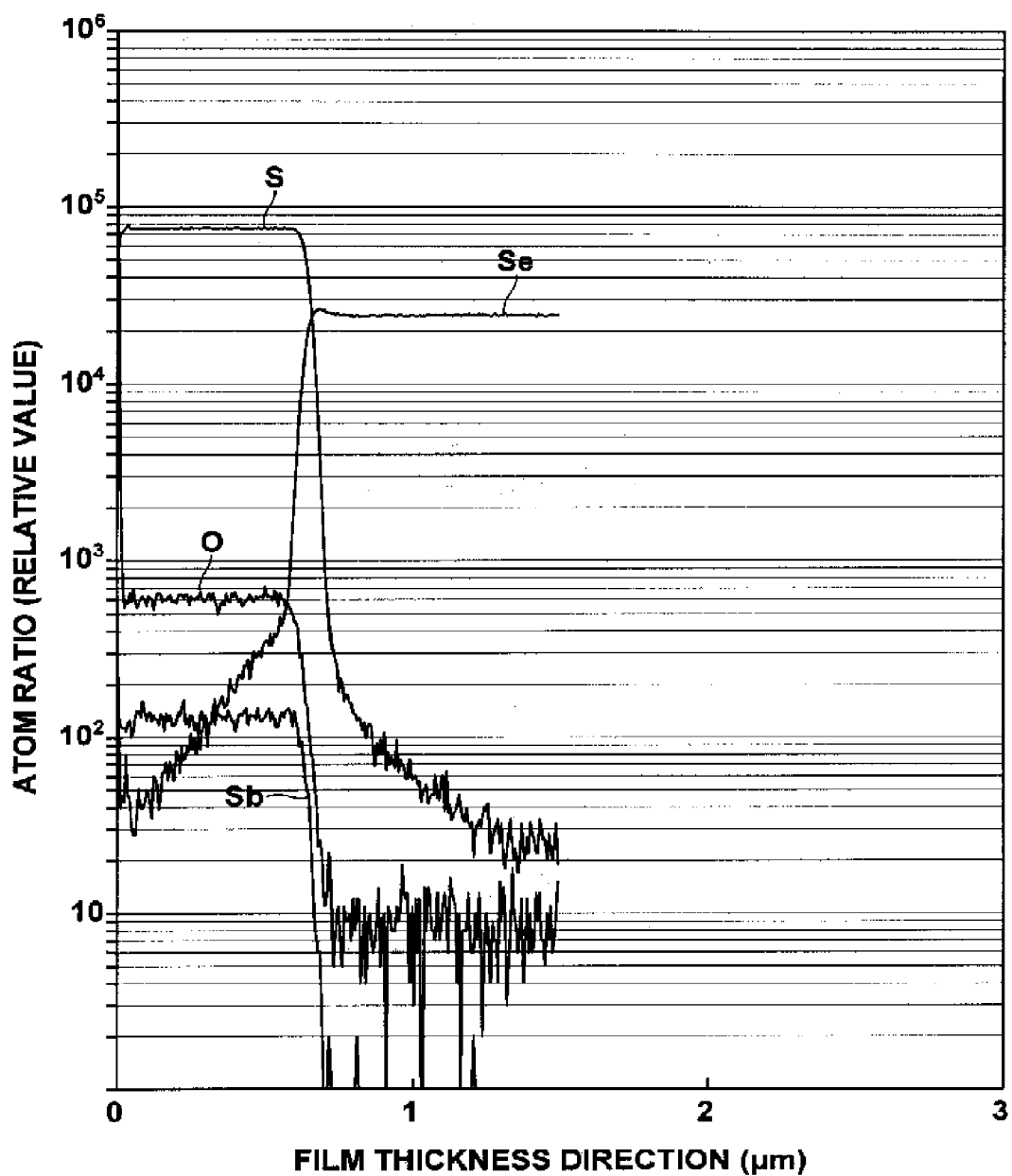
FIG. 6 illustrates the composition of the first charge transport layer and photoconductive layer when formed consecutively.

After photoconductive layer 4 and organic polymer layer 3 are formed in the manner as described above, formation of first charge transport layer 2 after exposing the substrate to gas that includes oxygen or water allows an area having an oxygen element density not less than three times the average density thereof in first charge transport layer 2 to be provided between first charge transport layer 2 and photoconductive layer 4. FIG. 5 illustrates the composition of first charge transport layer 2 and photoconductive layer 4 adjacent to the interface when these layers are formed in the manner as described above. Note that FIG. 5 shows the composition when $Sb_2S_3$, instead of $Sb_{42}S_{58}$, is used as the material of first charge transport layer 2 and organic polymer layer 3 is not provided, but it is thought that the identical results may be obtained with respect to oxygen element when $Sb_{42}S_{58}$ is used and organic polymer layer 3 is provided. For comparison purposes, FIG. 6 shows the composition of first charge transport layer 2 and photoconductive layer 4 adjacent to the interface thereof when first charge transport layer 2 is formed without exposing the substrate to gas that includes oxygen or water after photoconductive layer 4 and organic polymer layer 3 are formed. It shows that an area having an oxygen element density not less than three times the average density thereof in first charge transport layer 2 is not formed adjacent to the interface between first charge transport layer 2 and photoconductive layer 4. The composition of first transport layer 2 and photoconductive layer 4 is measured by SIMS while digging down the layers from the first charge transport layer side. Quantum numbers used in SIMS for S, Sb, Se, and O are 34, 121, 80, and 16 respectively.

Finally, Au is deposited on first transport layer 2 to form bias electrode 1 with a film thickness of 0.1 µm.

Thereafter, an evaluation of dark current, short term lag, and long term lag for Example 1 was conducted, the results of which are shown in FIG. 7. In dark current measurement, charge collecting electrode 61 of active matrix substrate 6 was connected to an IV amplifier, and a current detected by the IV amplifier was measured with an oscilloscope while applying +10 KV to bias electrode 1.

In short term lag evaluation, a pulse X-ray of 710 ms was irradiated on the Example 1 from an X-ray source with a tube voltage of 80 kV and a tube current of 100 mA. The X-ray dose at the radiation image detector was 400 mR. Then, charge collecting electrode 61 of the active matrix substrate was connected to the IV amplifier, and a temporal variation of current detected by the IV amplifier was measured with an oscilloscope while applying +10 KV to bias electrode 1. Here, a current value after 15 seconds from the termination of the pulse X-ray exposure was measured as the evaluation value of short term lag. Preferably, the evaluation value of short term lag is not greater than 0.12 mR and more preferably not greater than 0.012 mR when the current value is converted to radiation dose.

For long term lag evaluation, current flowing through charge collecting electrode 61 was measured after the exposure of pulse X-ray, as in the short term lag evaluation. Here, a current value after 300 seconds from the termination of the pulse X-ray exposure was measured as the evaluation value of long term lag. Preferably, the evaluation value of long term lag is not greater than 0.12 mR when the current value is converted to radiation dose.

The measurements of dark current, short term lag, and long term lag were conducted under two conditions, emitting backlight of 20 μW/mm$^2$ onto radiation image detector 10 from surface light source 20 and without emitting the backlight.

In the evaluation results shown in FIG. 7, a double circle mark indicates "excellent", a single circle mark indicates "good", a triangle mark indicates usable, and a cross mark indicates "not usable".

In the column of consecutive formation of second charge transport layer and photoconductive layer in the evaluation results, a single circle mark indicates that photoconductive layer 4 was formed without exposing second charge transport layer 5 to gas that includes oxygen or water after formed, and a cross mark indicates that photoconductive layer 4 was formed after exposing second charge transport layer 5 to gas that includes oxygen or water after formed.

Further, in the column of consecutive formation of first charge transport layer and photoconductive layer in the evaluation results, a cross mark indicates that first charge transport layer 2 was formed after exposing photoconductive layer 4 to gas that includes oxygen or water after formed, and a single circle mark indicates that first charge transport layer 2 was formed without exposing photoconductive layer 4 after formed.

FIG. 7 also indicates compositions of first and second charge transport layers and provision or non-provision of the organic polymer layer.

As seen from FIG. 7, Example 1 shows favorable results for all measured items of dark current, short term lag, and long term lag in comparison with Comparative Example 1. Comparative Example 1 was made in a manner identical to that of Example 1 except the following. Firstly, second charge transport 5 of antimony sulfide (with average composition of $Sb_2S_3$) with a film thickness of 2 μm is formed by heating an antimony sulfide material with the composition of $Sb_2S_3$ to a temperature of 555° C. Then, photoconductive layer 4 is formed after second charge transport layer 5 is exposed to gas that includes oxygen or water after formed. Secondly, the organic polymer layer is not provided, and thirdly, first charge transport 2 of antimony sulfide (with average composition of $Sb_2S_3$) with a film thickness of 0.6 μm is formed by heating an antimony sulfide material with the composition of $Sb_2S_3$ to a temperature of 555° C.

The favorable results of Example 1 for dark current might be attributed to the use of a material with composition of $Sb_{45}S_{55}$ for second charge transport layer 5, whereby the transmission factor for the light emitted from surface light source 20 is reduced and light emitted to photoconductive layer 4 is reduced.

The favorable results of Example 1 for short term lag and long term lag might be attributed to the following. The short term lag and long term lag occur when electric charges are trapped in an area adjacent to the interface between photoconductive layer 4 and second charge transport layer 5. In Example 1, second charge transport layer 5 and photoconductive layer 4 are formed consecutively, whereby the density of oxygen or chlorine in an area adjacent to the interface thereof is reduced and the charges trapped in the area are reduced.

Further, the short term lag also occurs when electric charges are drawn into photoconductive layer 4 from bias electrode 1. The favorable results of Example 1 for short term lag might also be attributed to the following. That is, in Example 1, first charge transport layer 2 and photoconductive layer are not formed consecutively, whereby an area which includes more oxygen elements is formed which acts as an electron hole blocking layer and electric charges drawn into photoconductive layer 4 from bias electrode 1 are reduced.

Still further, the short term lag also occurs when electric charges are trapped by defects in the interface of photoconductive layer 4 on the side of bias electrode 1. The favorable results of Example 1 for short term lag might also be attributed to the provision of organic polymer layer 3, whereby the defects in the interface of photoconductive layer 4 are reduced.

In the mean time, the long term lag also occurs when electric charges are trapped by the bulk of photoconductive layer 4. The favorable results of Example 1 for long term lag might also be attributed to the use of a material with composition of $Sb_{42}S_{58}$ for first charge transport layer 2. That is, this improves electron transportability and electric charges trapped by the bulk of photoconductive layer 4 are discharged efficiently to bias electrode 1.

Example 2

Example 2 was produced in the same manner as that of Example 1 other than that the composition of first charge transport layer 2 was changed to $Sb_{50}S_{50}$.

As seen from FIG. 7, Example 2 shows favorable results for all measured items of dark current, short term lag, and long term lag in comparison with Comparative Example 1. Further, identical results to those of Example 1 are obtained even though the composition of first charge transport layer 2 is changed to $Sb_{50}S_{50}$.

Example 3

Example 3 was produced in the same manner as that of Example 1 other than that the composition of second conductive layer was changed to $Sb_2S_3$, first charge transport layer 2 and photoconductive layer 4 were formed consecutively without organic polymer layer 3, and the composition of first charge transport layer 2 was changed to $Sb_2S_3$.

As seen from FIG. 7, Example 1 shows improvement in short term lag and long term lag in comparison with Comparative Example 1.

This might be attributed to the effects of consecutive formation of second charge transport layer 5 and photoconductive layer 4. However, the long term lag is not improved as much as in Example 1, since the composition of first charge transport layer 2 is changed to $Sb_2S_3$. Further, the short term lag is not improved as much as in Example 1, since first charge transport layer 2 and photoconductive layer 4 are formed consecutively without organic polymer layer 3. Still further, the dark current is not improved, since the composition of second charge transport layer 5 is changed to $Sb_2S_3$.

Example 4

Example 4 was produced in the same manner as that of Example 1 other than that first charge transport layer 2 and photoconductive layer 4 were formed consecutively without organic polymer layer 3 and the composition of first charge transport layer 2 was changed to $Sb_2S_3$.

As seen from FIG. 7, Example 4 shows improvement in short term lag and long term lag in comparison with Comparative Example 1.

This might be attributed to the effects of consecutive formation of second charge transport layer 5 and photoconductive layer 4. However, the long term lag is not improved as much as in Example 1, since the composition of first charge transport layer 2 is changed to $Sb_2S_3$. Further, the short term lag is not improved as much as in Example 1, since first charge transport layer 2 and photoconductive layer 4 are formed consecutively without organic polymer layer 3. Still further, the dark current is not improved as much as in Example 1, since first charge transport layer 2 and photoconductive layer 4 are formed consecutively, whereby more electric charges are drawn into photoconductive layer 5 from bias electrode 1 and dark current is increased, although the composition of second charge transport layer 5 is $Sb_{45}S_{55}$ as in Example 1.

Example 5

Example 5 was produced in the same manner as that of Example 1 other than that the composition of first charge transport layer 2 was changed to $Sb_2S_3$.

As seen from FIG. 7, Example 5 shows favorable results for all measured items of dark current, short term lag, and long term lag in comparison with Comparative Example 1. However, the long term lag is not improved as much as in Example 1, since the composition of first charge transport layer 2 is changed to $Sb_2S_3$.

Example 6

Example 6 was produced in the same manner as that of Example 1 other than that second charge transport layer 5 was formed in a vacuum chamber, exposed to gas that includes oxygen or water, returned to the vacuum chamber and exposed to an environmental temperature not less than 100° C. for a certain period of time, and thereafter photoconductive layer 4 was formed, instead of forming them consecutively. More specifically, Example 6 was produced by the following steps. That is, venting the vacuum chamber with nitrogen after forming second charge transport layer 5 to expose second charge transport layer 5 to air, evacuating the chamber again, heating second charge transport layer 5 at a temperature of 130° C. for 3 hours, reducing the temperature of second charge transport layer 5, and forming photoconductive layer 4 while maintaining the temperature of the second charge transport layer 5 at 40 to 55° C.

As seen from FIG. 7, Example 6 shows favorable results for all measured items of dark current, short term lag, and long term lag in comparison with Comparative Example 1. Although second charge transport layer 5 and photoconductive layer 4 are not formed consecutively, as do in Example 1, characteristics comparable to those of Example 1 are obtained by performing the baking process in the manner as described above.

Example 7

Example 7 was produced in the same manner as that of Example 4 other than that photoconductive layer 4 was exposed to gas that includes not less than 1 vol % of oxygen or water (e.g., air) after formed, and then first charge transport layer 2 was formed.

As seen from FIG. 7, Example 7 shows favorable results for all measured items of dark current, short term lag, and long term lag in comparison with Comparative Example 1. With respect to the dark current, Example 4 does not show improvement in comparison with Comparative Example 1 since first charge transport layer 2 and photoconductive layer 4 are formed consecutively, while in Example 7, they are not formed consecutively, so that the dark current characteristics are improved in comparison with Comparative Example 1 and Example 4.

Example 8

Example 8 was produced in the same manner as that of Example 7 other than that the composition of first charge transport layer 2 and second charge transport layer 5 was changed to $Sb_{50}S_{50}$.

As seen from FIG. 7, Example 8 shows favorable results for all measured items of dark current, short term lag, and long term lag in comparison with Comparative Example 1.

What is claimed is:

1. A radiation image detection apparatus, comprising a radiation image detector that includes the following stacked in the order listed below:
    a bias electrode to which a bias voltage is applied;
    a photoconductive layer that generates electric charges by receiving a recording electromagnetic wave representing a radiation image;
    a substrate side charge transport layer that transports the electric charges generated in the photoconductive layer; and
    an active matrix substrate having multiple charge collecting electrodes disposed thereon for collecting the electric charges generated in the photoconductive layer,
    wherein the radiation image detector does not include an area adjacent to the interface between the substrate side charge transport layer and photoconductive layer having an oxygen or chlorine element density not less than two times the average density thereof in the substrate side charge transport layer, and
    the substrate side charge transport layer has an average composition of SbxS100-x ($41 \leq x \leq 60$).

2. The radiation image detection apparatus as claimed in claim 1, wherein:
    the apparatus further comprises a light emitting means for emitting light on the radiation image detector from the side of the active matrix substrate while at least the recording electromagnetic wave is irradiated on the radiation image detector; and
    the substrate side charge transport layer has a transmission factor within a range from 0.01% to 10% for the light.

3. The radiation image detection apparatus as claimed in claim 1, wherein:
    the apparatus further comprises a bias electrode side charge transport layer between the bias electrode and photoconductive layer; and
    the bias electrode side charge transport layer is a layer that includes antimony sulfide.

4. The radiation image detection apparatus as claimed in claim 3, wherein:
    the bias electrode side charge transport layer has an average composition of SbxS100-x ($41 < x < 60$).

5. The radiation image detection apparatus as claimed in claim 3, further comprising:

an organic polymer layer that includes an electron hole blocking material between the bias electrode side charge transport layer and photoconductive layer.

6. The radiation image detection apparatus as claimed in claim 5, wherein:

the electron hole blocking material is at least one type of carbon cluster selected from a group consisting of Fullerene C60, Fullerene C70, fullerene oxide, and derivatives thereof.

7. The radiation image detection apparatus as claimed in claim 1, wherein:

the substrate side charge transport layer is formed by $Sb_{45}S_{55}$.

8. The radiation image detection apparatus as claimed in claim 1, wherein:

the substrate side charge transport layer is formed by $Sb_{50}S_{50}$.

9. The radiation image detection apparatus as claimed in claim 4, wherein:

the bias electrode side charge transport layer is formed by $Sb_{42}S_{58}$.

10. The radiation image detection apparatus as claimed in claim 4, wherein:

the bias electrode side charge transport layer is formed by $Sb_{50}S_{50}$.

* * * * *